(12) United States Patent
Li

(10) Patent No.: US 10,529,793 B2
(45) Date of Patent: Jan. 7, 2020

(54) DISPLAY PANEL AND DISPLAY DEVICE

(71) Applicant: WUHAN TIANMA MICRO-ELECTRONICS CO., LTD., Wuhan (CN)

(72) Inventor: Yin Li, Wuhan (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 0 days.

(21) Appl. No.: 16/213,306

(22) Filed: Dec. 7, 2018

(65) Prior Publication Data
US 2019/0371879 A1    Dec. 5, 2019

(30) Foreign Application Priority Data
May 31, 2018 (CN) .......................... 2018 1 0552433

(51) Int. Cl.
*H01L 27/32* (2006.01)
*H01L 51/00* (2006.01)
*G09G 3/3225* (2016.01)

(52) U.S. Cl.
CPC ...... *H01L 27/3279* (2013.01); *H01L 27/3258* (2013.01); *H01L 51/0097* (2013.01); *G09G 3/3225* (2013.01); *G09G 2320/0233* (2013.01); *G09G 2380/02* (2013.01); *H01L 2251/301* (2013.01); *H01L 2251/5338* (2013.01); *H01L 2251/558* (2013.01)

(58) Field of Classification Search
CPC .......................... H01L 51/0097; H01L 27/3276
See application file for complete search history.

(56) References Cited

U.S. PATENT DOCUMENTS

| 2014/0306941 A1* | 10/2014 | Kim ...................... G06F 1/1652 |
| | | 345/204 |
| 2017/0194411 A1* | 7/2017 | Park .................... H01L 51/5253 |

FOREIGN PATENT DOCUMENTS

CN            104733498 A        6/2015

* cited by examiner

*Primary Examiner* — Yu-Hsi D Sun
(74) *Attorney, Agent, or Firm* — Anova Law Group PLLC

(57) ABSTRACT

A display panel includes a substrate that comprises a bending zone and a non-bending zone. The substrate is disposed with first signal lines. The first signal lines are arranged in a first direction and extend in a second direction. The first direction intersects with the second direction. The first signal lines extend at least from the non-bending zone to the bending zone. A thickness of a portion of the first signal lines located in the bending zone is larger than a thickness of a portion of the first signal lines located in the non-bending zone; or the display panel further includes at least one auxiliary conductive portion located in the bending zone, wherein the orthographic projection of the auxiliary conductive portion on the substrate overlaps with the orthographic projection of the first signal line on the substrate.

15 Claims, 14 Drawing Sheets

11 (80)

DISPLAY PANEL AND DISPLAY DEVICE

CROSS-REFERENCES TO RELATED APPLICATIONS

This application claims priority of Chinese Patent Application No. 201810552433.6, filed on May 31, 2018, the entire contents of which are hereby incorporated by reference.

FIELD OF THE INVENTION

The present disclosure generally relates to the field of display technologies and, more particularly, relates to a display panel and a display device.

BACKGROUND

In recent years, organic light-emitting diode (OLED) technology became very popular, and is regarded as a leading technology for next generation flat panel display. An OLED display panel has low power consumption, self-illumination, wide viewing angle, fast response time, high luminous efficiency and thin panel thickness. Large-size and foldable OLED display panels may be fabricated with a simple fabrication process and at a low cost. In addition, a foldable display device may be easily carried, and is an important development direction for display devices in the future.

At present, in the fabrication process of a foldable display device, usually a plurality of small display screens are connected together to form a whole display panel, and the connection portions serve as folding areas. A foldable display panel formed by connecting a plurality of small flexible display screens may be used in a large display device. However, if a foldable display panel formed by connecting a plurality of small flexible display screens is used in a small-size display device, such as a mobile phone, a tablet computer, etc., the display effect near the folding areas may be not ideal, and thus the display quality of the entire display panel may be affected.

In addition, for a flexible display panel, if the bending radius is large, the bending effect of the display panel may be achieved without a bending endurance capability design for the circuits in the display panel. However, in the case when the bending radius is small, the circuits of the display panel may become ineffective due to the influence of a large bending stress, thus affecting the display quality of the bending area of the display panel.

The disclosed methods and structures are directed to solve one or more problems set forth above and other problems in the art.

BRIEF SUMMARY OF THE DISCLOSURE

One aspect of the present disclosure includes a display panel. The display panel includes a substrate that comprises a bending zone and a non-bending zone. The substrate is disposed with first signal lines. The first signal lines are arranged in a first direction and extend in a second direction. The first direction intersects with the second direction. The first signal lines extend at least from the non-bending zone to the bending zone. A thickness of a portion of the first signal lines located in the bending zone is larger than a thickness of a portion of the first signal lines located in the non-bending zone; or the display panel further includes at least one auxiliary conductive portion located in the bending zone, wherein the orthographic projection of the auxiliary conductive portion on the substrate overlaps with the orthographic projection of the first signal line on the substrate.

Another aspect of the present disclosure includes a display device. The display device includes a display panel comprising a substrate that includes a bending zone and a non-bending zone. The substrate is disposed with first signal lines. The first signal lines are arranged in a first direction and extend in a second direction. The first direction intersects with the second direction. The first signal lines extend at least from the non-bending zone to the bending zone. A thickness of a portion of the first signal lines located in the bending zone is larger than a thickness of a portion of the first signal lines located in the non-bending zone; or the display panel further includes at least one auxiliary conductive portion located in the bending zone, wherein the orthographic projection of the auxiliary conductive portion on the substrate overlaps with the orthographic projection of the first signal line on the substrate.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
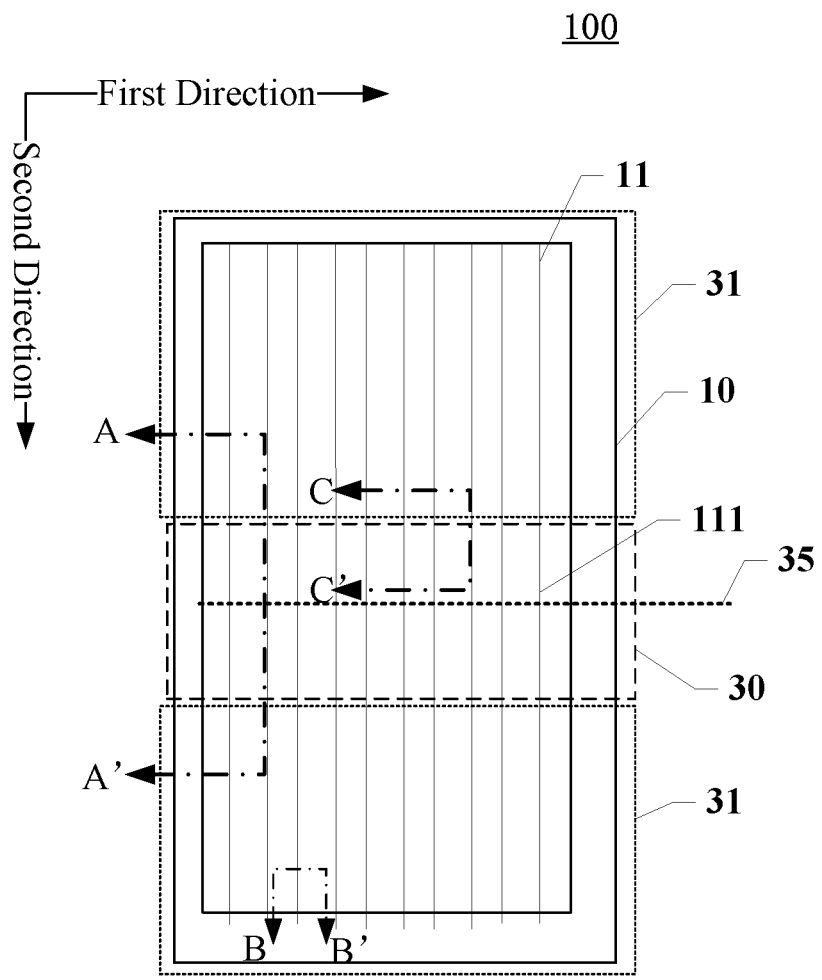
FIG. 1 illustrates a top view of an exemplary display panel consistent with the disclosed embodiments.

To make the objectives, technical solutions and advantages of the present invention more clear and explicit, the present invention is described in further detail with accompanying drawings and embodiments. It should be understood that the specific exemplary embodiments described herein are only for explaining the present invention and are not intended to limit the present invention.

Reference will now be made in detail to exemplary embodiments of the present invention, which are illustrated in the accompanying drawings. Wherever possible, the same reference numbers will be used throughout the drawings to refer to the same or like parts.

In the present disclosure, certain terms are used to refer to particular components. Those skilled in the art should understand that hardware manufacturers may use different terms to refer to a same component. In the present disclosure, components are distinguished based on the differences in their functions, instead of the differences in their names. The word "including" used in the present disclosure is an open term, and should be interpreted as "including but not limited to". The word "approximately" means that within an acceptable error range, those skilled in the art are able to solve the technical problems, and substantially achieve the technical effects. The word "coupling" is used herein to include any direct and indirect electrical coupling means. In the present disclosure, if a first device is electrically coupled to a second device, the first device may be electrically coupled to the second device directly, or the first device may be electrically coupled indirectly to the second device, through other devices or coupling means.

Currently, for a flexible display panel, if the bending radius is large, the bending effect of the display panel may be achieved without a bending endurance capability design for the circuits in the display panel. However, in the case when the bending radius is small, the circuits of the display panel may become ineffective due to the influence of a large bending stress, thus affecting the display quality of the bending area of the display panel.

The present disclosure provides an improved display panel and display device. In the disclosed display panel and the display device, the thickness of a first signal line in the bending zone is increased, or an auxiliary conductive portion is provided to a first signal line in the bending zone. In this way, the fracture possibility of the first signal line during a bending procedure of the bending zone may be decreased.

An exemplary display panel consistent with the disclosed embodiments comprises a substrate including a bending zone and a non-bending zone. The substrate is disposed with first signal lines. The first signal lines are arranged in a first direction, extending in a second direction. The first direction intersects with the second direction. The first signal lines extend at least from a non-bending zone to a bending zone.

The thickness of the portion of a first signal line located in the bending zone is larger than the thickness of the portion of the first signal line located in the non-bending zone. The display panel further includes at least one auxiliary conductive portion located in the bending zone. The orthographic projection of the auxiliary conductive portion on the substrate overlaps with the orthographic projection of the first signal line on the substrate.

Figure 2:
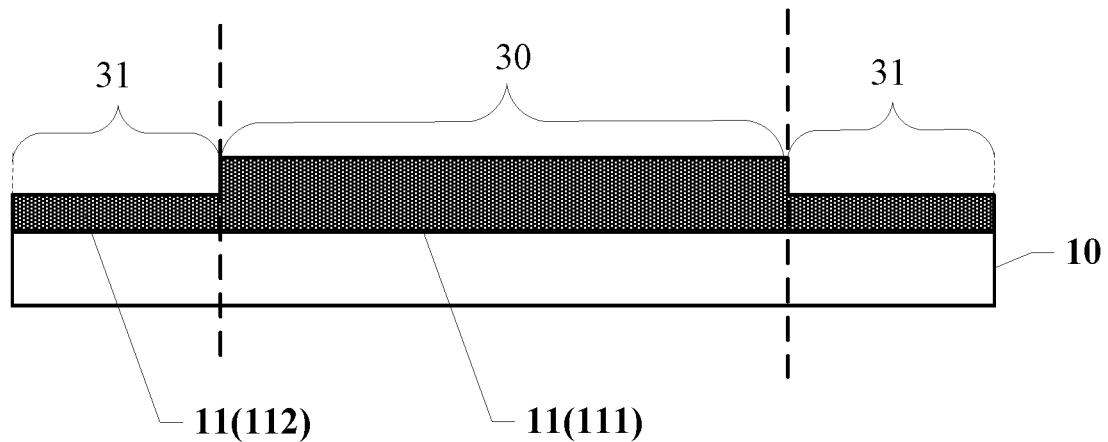
FIG. 2 illustrates an exemplary partial cross-sectional view at the A-A' cross section of the exemplary display panel illustrated in FIG. 1, consistent with the disclosed embodiments.

Specifically, FIG. 1 illustrates a top view of an exemplary display panel, and FIG. 2 illustrates an exemplary partial cross-sectional view at the A-A' cross section of the exemplary display panel illustrated in FIG. 1. As shown in FIG. 1 and FIG. 2, a display panel 100 includes a bending zone 30 and a non-bending zone 31. The non-bending zones 31 are located on two sides of the bending zone 30 respectively.

Optionally, a display panel 100 includes a display area (not shown in FIG. 1 and FIG. 2) and a non-display area (not shown in FIG. 1 and FIG. 2) surrounding the display area. Optionally, both the display area and the non-display area may include a bending zone 30 and a non-bending zone 31.

The substrate 10 is disposed with a plurality of first signal lines 11 arranged in the first direction and extending in the second direction. The first signal lines 11 extend from a non-bending zone 31 to a bending zone 30, and then extend from the bending zone 30 to another non-bending zone 31. That is, the first signal lines 11 pass through the bend zone 30.

Optionally, the thickness of the portion 111 of a first signal line 11 located in the bending zone 30 is greater than the thickness of the portion of the first signal line 11 located at the non-bending zone 31. The thickness herein is the distance between the side of the first signal line 11 close to the substrate 10 and the side of the first signal line 11 away from the substrate 10, in a direction perpendicular to the substrate 10.

Optionally, the extending direction of the bending axis 35 of the bending zone 30 is the first direction.

Figure 3:
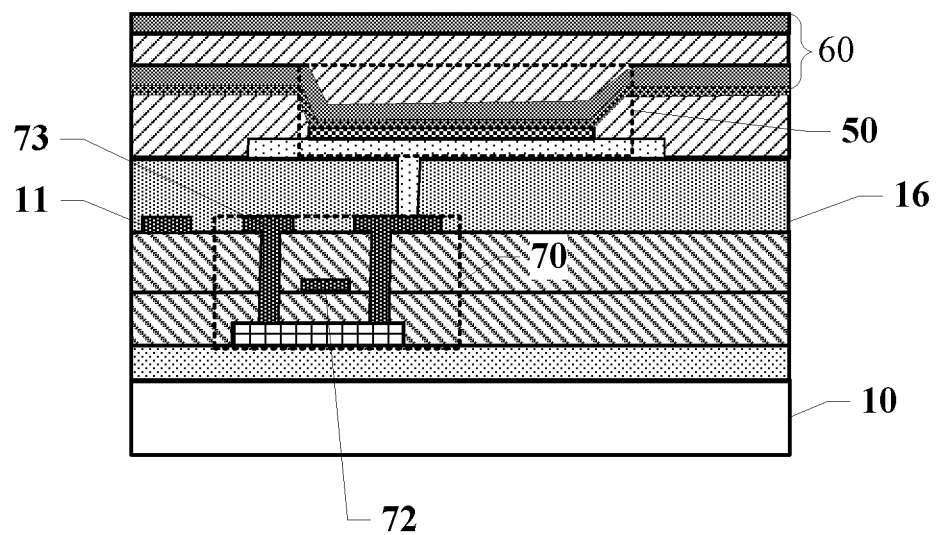
FIG. 3 illustrates an exemplary cross-sectional view at the B-B' cross section of the exemplary display panel illustrated in FIG. 1, consistent with the disclosed embodiments.

FIG. 3 illustrates an exemplary cross-sectional view at the B-B' cross section of the exemplary display panel illustrated in FIG. 1. As shown in FIG. 3, the display panel 100 further includes a thin film transistor array layer 70 and a first planarization layer 16. The thin film transistor array layer 70 is located between the first planarization layer 16 and the substrate 10.

The thin film transistor array layer 70 includes a gate metal layer 72 and a source/drain metal layer 73. In this embodiment, the first signal line 11 and the source/drain metal layer 73 are disposed in a same layer.

Optionally, the first signal line 11 is a power line, and the power line is located in the display area. A display area generally includes a plurality of pixel units, and the power line is used to provide a constant power voltage signal for each pixel unit.

In other embodiments of the present disclosure, the first signal line 11 may be a data line, and the data line is located in the display area for providing data signals to each pixel unit.

To meet users' usage habits and be convenient for holding, the appearance of a display panel is usually designed as a rectangular structure as shown in FIG. 1. The display panel has two oppositely disposed long sides and two oppositely disposed short sides. The two long sides extend in the second direction, and the two short sides extend in the first direction.

In the top view shown in FIG. 1, a driving chip is usually disposed at the lower end of the display panel, so that the driving chip may be electrically connected to the data lines and the power lines at the lower end of the display panel easily. The data lines and the power lines extend in the second direction. That is, the extending direction of the data lines and the power lines is the same as the extending direction of the long sides of the display panel. When a display panel is bent, the two long sides of the display panel are usually bent, so that the bending is most effective, and the display panel is more portable. Therefore the extending direction of the bending axis is usually selected to be in the first direction, and the data lines and the power lines extending in the second direction are subject to large bending stresses. The present disclosure improves the stress endurance capabilities of data lines and power lines. For example, increasing the thickness of the portions of data lines and power lines located in the bending zone may reduce the fracture possibility of the data lines and the power lines.

It should be noted that, as shown in FIG. 3, a light-emitting function layer 50 and a thin film encapsulation layer 60 for encapsulating the light-emitting function layer 50 are further disposed on the side of the thin film transistor array layer 70 away from the substrate 10.

Specifically, in this embodiment, at least a part of a first signal line 11 is located in the bending zone 30. When the bending zone 30 is bent, the portion 111 of the first signal line 11 located in the bending zone 30 may be subject to a large bending stress. To prevent the portion 111 of the first signal line 11 located in the bending zone 30 from fracturing due to an excessive bending stress, the thickness of the portion 111 of the first signal line 11 located in the bending zone 30 is increased. Therefore the thickness of the portion 111 of the first signal line 11 located at the bending zone 30 is greater than the thickness of the portion 112 of the first signal line 11 located at the non-bending portion 31. This is equivalent to increasing the cross sectional area of the portion 111 of the first signal line 11 located in the bending zone 30. The cross sectional area herein refers to the cross sectional area of the first signal line in the direction perpendicular to the substrate and perpendicular to the extending direction of the first signal line.

Compared to the part of the first signal line 11 without an increased thickness, the portion 111 of the first signal line 11 with increased thickness requires a larger bending stress to fracture. That is, increasing the thickness of the portion 111 of the first signal line 11 located in the bending zone 30 can increase the bending endurance capability of the portion 111 of the first signal line 11 located in the bending zone 30. Therefore, when a bending zone is bent, the fracture possibility of the portion 111 of the first line 11 located in the bent region 30 due to the bent stress may be reduced.

When the extending direction of the first signal line 11 is parallel to the extending direction of the bending axis 35, during the bending process of the bending zone 30, the bending stress received by the first signal line 11 may be small. In this case, even if the thickness of the first signal line 11 is not increased, maybe the first signal line 11 does not fracture.

When the extending direction of the bending axis 35 of a bending zone 30 is in the first direction, the extending direction of the first signal line 11 intersects with the extending direction of the bending axis 35 of the bending zone 30. In the bending process of the bending zone 30, the first signal line 11 may be subjected to a large bending stress. In this case, the increase of the thickness of the portion 111 of the first signal line 11 located in the bending zone 30 may effectively improve the bending endurance capability of the first signal line 11.

It should be noted that, in this embodiment, the first signal line 11 may be a data line or a power line. When the first signal line 11 and the source/drain metal layer 73 are disposed in a same layer, the first signal line 11 may play a role of a data line for transmitting data signals, or play a role of a power line in transmitting power signals. Further, this configuration may avoid the need of disposing a separate layer for the first signal line 11, and is thus beneficial for simplifying the fabrication steps and improving the production efficiency.

It should be noted that the disclosed embodiments of the present disclosure, for example, the embodiments shown in FIG. 1 and FIG. 2, only schematically show the arrangement of first signal lines 11, and do not represent the actual number and size of the first signal lines 11.

Figure 4:
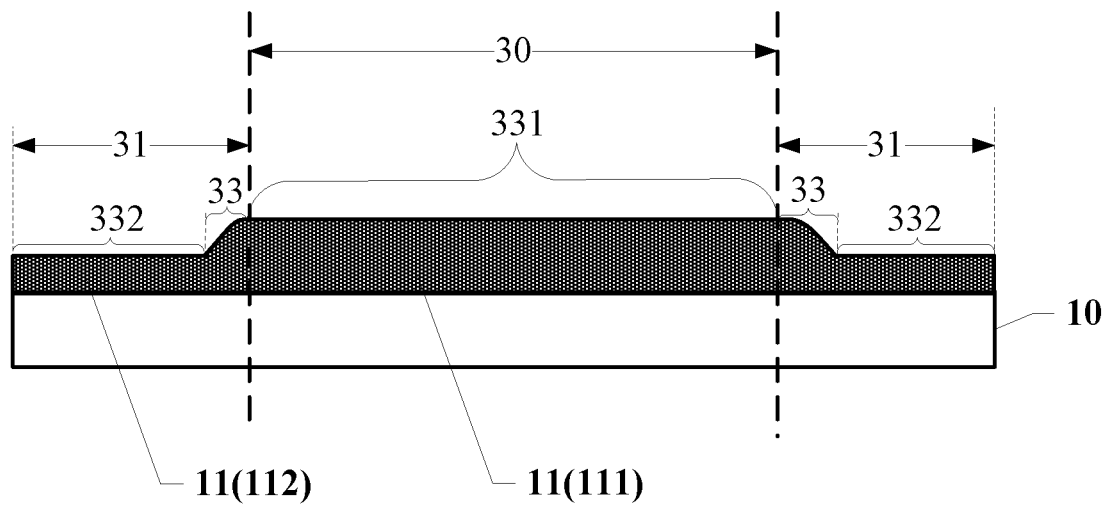
FIG. 4 illustrates another exemplary partial cross-sectional view at the A-A' cross section of the exemplary display panel illustrated in FIG. 1, consistent with the disclosed embodiments.

Optionally, FIG. 4 illustrates another exemplary partial cross-sectional view at the A-A' cross section of the exemplary display panel illustrated in FIG. 1. As shown in FIG. 4, a first signal line 11 includes a first extension region 331, a second extension region 332, and a first transition region 33 between the first extension region 331 and the second extension zone 332. The first extension region 331 is located in the bending zone 30, and the second extension region is located in the non-bending zone 31. The thickness of the first extension region 331 is larger than the thickness of the second extension region 332.

In the direction from the first extension region 331 to the second extension region 332, the thickness of the first transition zone 33 decreases from the center of the first signal line 11 to the edge of the first signal line 11, wherein the thickness is the thickness in the direction perpendicular to the substrate 10. It should be noted that the direction from the first extension region 331 to the second extension region 332 is also the direction from the bending zone 30 to the non-bending zone 31.

Specifically, if the thickness of the portion 111 of the first signal line 11 located at the bending zone 30 is increased, the thickness of the portion 111 of the first signal line 11 located at the bending zone 30 and the thickness of the portion 112 of the first signal line 11 located at the non-bending zone 31 are significantly different. When a first signal line 11 has a sharp thickness change region, in a bending process, the stress in the sharp thickness change region may have a sharp change of stress. A sharp change of tensile stress may lead to a fracture of the sharp thickness change region.

In one embodiment, the first signal line 11 includes a first transition region 33. In the direction from the first extension region 331 to the second extension region 332, the thickness of the first transition region 33 decreases. That is, in the first transition region 33, the thickness of the first signal line 11 changes gradually. In a bending process, at the region where the thickness changes gradually, the tensile stress also changes gradually. The design with a gradual thickness change may avoid a sharp change of stress in a first signal line 11 during a bending process, and thus avoiding the fracture of the first signal line 11 due to a sharp stress change in the first signal line 11. In addition, the thickness of the first signal line 11 in the first transition region 33 is between the thickness of the first signal line 11 in the non-bending area and the thickness of the first signal line 11 in the bending area. Therefore, the thickness transition region 33 prevents a sharp thickness change in the first signal line 11.

Optionally, in the embodiment shown in FIG. 4, the first transition region 33 is located in the non-bending zone 31. During a bending process of the bending zone 30, the stress received by the portion 111 located in the bending zone 30 is greater than the stress received by the portion 112 of the first signal line 11 located in the non-bending zone 31. When a transition region 33 is disposed in the non-bending zone 31, the transition region 33 is subjected to a less stress. This configuration may reduce the fracture possibility of the first transition region 33 due to the influence of stress during the bending process of the bending zone 30.

In addition, if a first transition zone 33 is disposed in a bending zone 30, since the stress in the bending zone 30 is large, if the thickness of the first signal line 11 is not uniform in the bending zone 30, fracture is likely to occur. If a first transition zone 33 is disposed in the non-bending zone 31, the thickness of the portion 111 of the first signal line 11 in the bending zone 30 may be kept uniform. In this case, the stress of the bending zone 30 is consistent, and fracture is not likely to occur.

Optionally, the thickness of the portion 111 of the first signal line 11 located in the bending zone 30 is D0, where 825 nm≤D0≤1510 nm.

Generally, the thickness of the portion 112 of the first signal line 11 in the non-bending area 31 is about 755 nm. In one embodiment, the thickness of the portion 111 of the first signal line 11 located in the bending zone 30 is 825 nm≤D0≤1510 nm. The thickness of the portion 111 of the first signal line 11 located in the bending area is larger than the thickness of the portion 112 located at the non-bending area 31 of the first signal line 11. This configuration may avoid the fracture phenomenon of the portion 111 that endures a large bending stress when the bending portion 30 is bent. Further, the thickness of the portion 111 of the first signal line 11 located in the bending portion 30 is limited to be not more than 1510 nm, so that the thickness of the portion 111 is not excessively large. If the thickness of the portion 111 is excessively large, the required external bending force may be very large, and thus the display panel may be not easily bent. Therefore, the thickness design of 825 nm≤D0≤1510 nm is such that the portion 111 of the first signal line 11 located in the bending zone 30 has a certain bending endurance capability, and meanwhile the display panel 100 may be easily bent.

Figure 5:
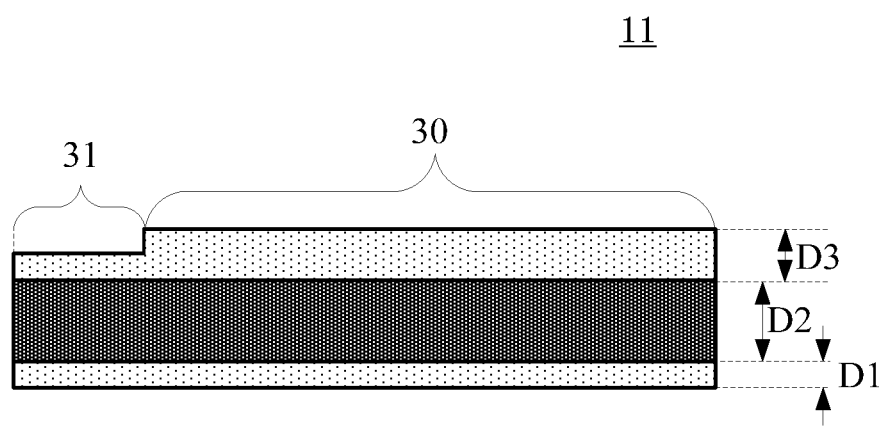
FIG. 5 is illustrates a cross-sectional view at the C-C' cross section of an exemplary first signal line in the exemplary display panel illustrated in FIG. 1, consistent with the disclosed embodiments.

FIG. 5 illustrates an exemplary cross-sectional view at the C-C' cross section of an exemplary first signal line in the exemplary display panel illustrated in FIG. 1. The first signal line 111 located in the bending zone 30 includes a first titanium (Ti) layer, an aluminum (Al) layer, and a second titanium (Ti) layer, sequentially disposed in a direction away from the surface of the substrate 10. The thickness of the first Ti layer is D1, the thickness of the Al layer is D2, and the thickness of the second Ti layer is D3, wherein 45 nm≤D1≤90 nm, 700 nm≤D2≤1260 nm, 80 nm≤D3≤160 nm.

Specifically, since the first signal line 11 is used for transmitting data signals or electric signals, and aluminum has a good signal transmission capability, aluminum is selected as a carrier for the signal transmission of the first signal line 11. Since the corrosion resistance of aluminum is weak, the first Ti layer and the second Ti layer are coated on the outer sides of the aluminum layer. This configuration may prevent the aluminum layer from contacting with its external environment. If the aluminum layer contacts with its external environment, the aluminum layer may be corroded, and thus normal signal transmission may be not performed.

In one embodiment, the thickness range of the first Ti layer is 45 nm-90 nm, the thickness range of the Al layer is 700 nm-1260 nm, and the thickness range of the second Ti layer is 80 nm-160 nm. To ensure that the aluminum layer can perform reliable signal transmission, the aluminum layer is designed to be the thickest. For the first titanium layer, it is thick enough as long as it may block the external environment from contacting the aluminum layer. The second titanium layer should be thick enough to block the external environment from contacting the aluminum layer. Moreover the thickness of the second titanium layer should be properly designed so that the thickness of the portion of the first signal line 11 located at the bending zone 30 is larger than the portion of the first signal line 11 located at the non-bending zone 31.

It should be noted that, in the fabrication process of a first signal line 11, the bending zone 30 and the non-bending zone 31 may be coated with a uniform manufacturing method and size. After that, the portion of the bend zone 30 is further coated so that the thickness of the portion located in the bend zone 30 is larger than the thickness of the portion located in the non-bend zone 31. Herein the further coating at the portion located in the bending zone 30, for example, may be increasing the thickness of the second titanium layer (as shown in FIG. 5), or may be additionally coating with other conductive materials.

Figure 6:
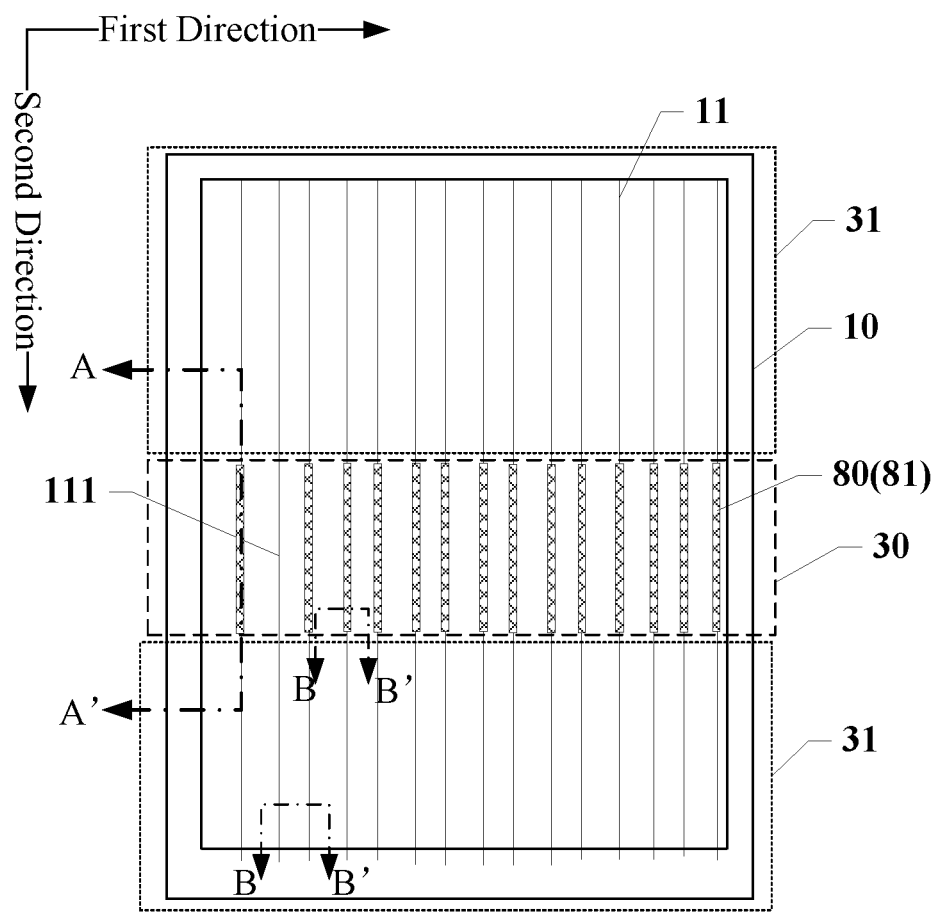
FIG. 6 illustrates a top view of another exemplary display panel consistent with the disclosed embodiments.
Figure 7:
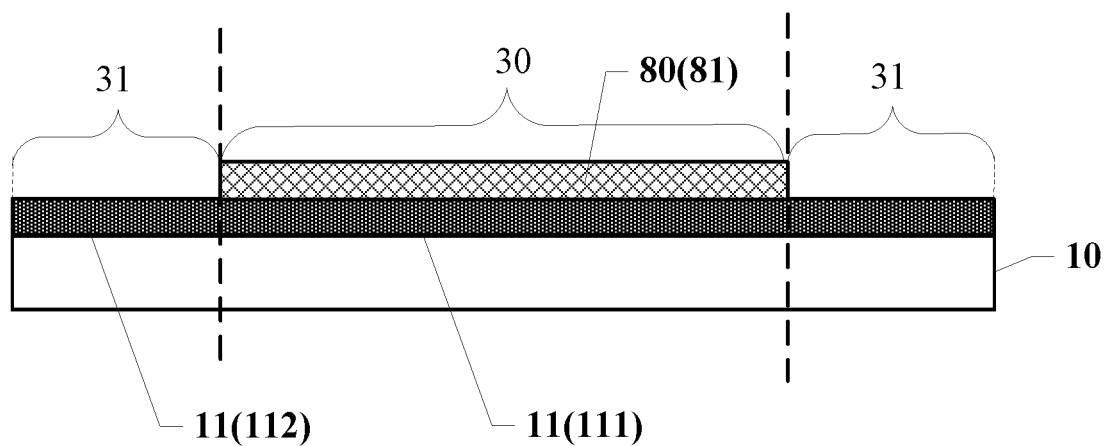
FIG. 7 illustrates an exemplary cross-sectional view at the A-A' cross section of the exemplary display panel illustrated in FIG. 6, consistent with the disclosed embodiments.

FIG. 6 illustrates a top view of another exemplary display panel, and FIG. 7 illustrates an exemplary cross-sectional view at the A-A' cross section of the exemplary display panel illustrated in FIG. 6.

In one embodiment, the display panel 100 further includes at least one auxiliary conductive portion 80 located in the bending zone 30. The orthographic projection of the auxiliary conductive portion 80 on the substrate 10 and the orthographic projection of a first signal line 11 on the substrate 10 overlap.

Optionally, as shown in FIG. 6, an auxiliary conductive portion 80 includes at least one first auxiliary conductive portion 81 extending in the second direction. The orthographic projection of the first auxiliary conductive portion 81 on the substrate 10 overlaps with the orthographic projection of a first signal line 11 on the substrate 10. That is, in the bending zone 30, the first auxiliary conductive portion 81 extends along the path of the first signal line 11.

FIG. 7 illustrates an exemplary cross-sectional view at the A-A' cross section of the exemplary display panel illustrated in FIG. 6. When the bending zone 30 is bent, the first auxiliary conductive portion 81 is located on the side of the first signal line 11 close to the convex side surface of the bending zone 30. The first auxiliary conductive portion 81 may cover the surface of the first signal line 11 away from the substrate 10.

Specifically, as shown in FIG. 6 and FIG. 7, the auxiliary conductive portion 80 is embodied as a first auxiliary conductive portion 81. The extending direction of the first auxiliary conductive portion 81 is the same as the extending direction of the first signal line 11, and the first auxiliary conductive portion 81 overlaps with the first signal line 11 in a direction perpendicular to the substrate 10. When the bending zone 30 is bent, the first auxiliary conductive portion 81 is close to the convex side surface of the bending zone 30, and the first signal line 11 is away from the convex side surface of the bending zone 30 with respect to the first auxiliary conductive portion 81. The convex side surface herein refers to the surface of the side of a display panel that is subject to a tensile stress when the bending zone is bent. For example, when the extending direction of the bending axis is parallel to the first direction, and the display panel is bent downward from the light emitting surface of the display panel, the light emitting surface is a convex side surface.

When a display panel is bent, the tensile stress may cause the molecular structure of a signal line to split, and the compressive stress may make the molecular structure of a signal line more compact. Therefore, a signal line may fracture under a tensile stress. A first auxiliary conductive portion 81 is located on the side of a first signal line 11 close to the convex side surface of a bending portion 30. At a same bending state, the first auxiliary conductive portion 81 is stretched to a greater extent, and the tensile stress received by the first auxiliary conductive portion 81 is larger. The first signal line 11 is stretched to a smaller extent, and the tensile stress received by the first signal line 11 is less.

If the tensile stresses causing the first auxiliary conductive portion 81 and the first signal line 11, respectively, to fracture are N, during a bending process, even if the tensile stress received by the first auxiliary conductive portion 81 reaches N, the tensile stress received by the first signal line 11 may be less than N. Therefore, even if fracture is likely to occur, the first auxiliary conductive portion 81 fractures first, and maybe the first signal line 11 does not fracture. The introduction of a first auxiliary conductive portion 81 is equivalent to reducing the tensile stress received by a first signal line 11 during the bending process of a bending zone 30, and effectively reduces the fracture possibility of the first signal line 11 during the bending process of the bending zone 30.

In addition, in one embodiment, the first auxiliary conductive portion 81 is in direct contact with the first signal line 11. The introduction of the first auxiliary conductive portion 81 is equivalent to increasing the thickness of the portion 111 of the first signal line 11 located in the bending zone 30. Therefore, a larger bending force is required to make the first signal line 11 to fracture during the bending process of the bending zone 30. This is equivalent to improving the bending endurance capability of the first signal line 11, which can reduce the fracture possibility of the first signal line 11 during the bending process of the bending zone 30.

Optionally, the first auxiliary conductive portion 81 is located on the side of a first signal line 11 away from the substrate 10.

In other embodiments of the present disclosure, the first auxiliary conductive portion may be disposed on the side of the first signal line close to the substrate 10.

When a display panel is bent, there is a neutral surface in the display panel. The neutral surface is a critical surface, wherein neither a tensile stress nor a compressive stress is applied during a bending process. The layer on the side of the neutral surface close to the convex side surface is subjected to a tensile stress, and the layer on the side of the neutral surface away from the convex side surface is subjected to a compressive stress. When a layer is placed at a position closer to the neutral surface, the layer receives a weaker stress. Since the bending endurance capability of an array layer is weak, the neutral plane is usually placed on the array layer as much as possible. However, since a light-emitting functional layer and a thin film encapsulation layer are disposed on the array layer in a display panel, the neutral surface may move up relative to the array layer.

When a first auxiliary conductive portion is disposed on the side of the first signal line close to the substrate, it is equivalent to increasing the thickness of the layer on the side of the first signal line close to the substrate, and the neutral surface may move down relative to the array layer, approaching the first signal line. In this case, since the first signal line becomes closer to the neutral surface, the stress received by the first signal line becomes weaker. Therefore this design may reduce the stress received by the first signal line during the bending process of a bending zone, reducing the fracture possibility of the first signal line during the bending process of the bending zone. Provided that other functions of a first auxiliary conductive portion are ensured, the position of a neutral surface may be adjusted by adjusting the first auxiliary conductive portion. In this way, the first signal line may be made to be closer to the neutral plane.

Figure 8:
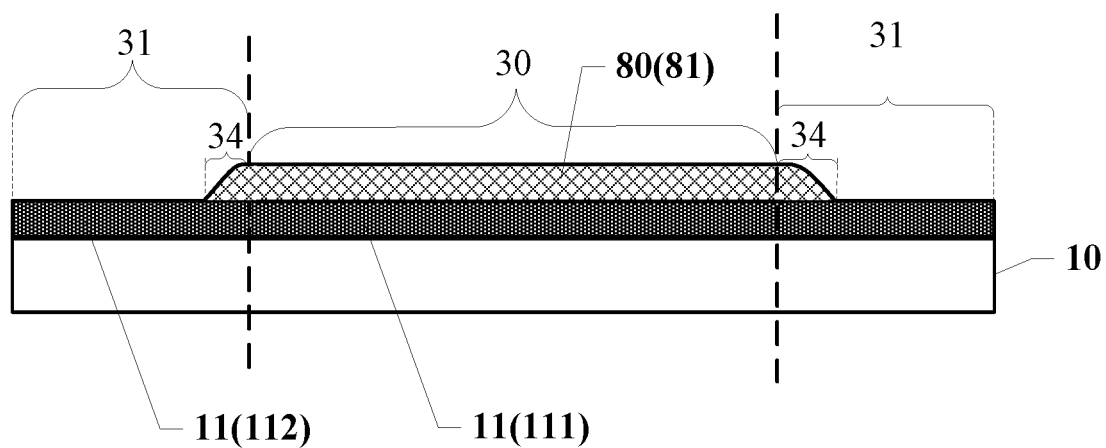
FIG. 8 illustrates another exemplary cross-sectional view at the A-A' cross section of the exemplary display panel illustrated in FIG. 6, consistent with the disclosed embodiments.

FIG. 8 illustrates another exemplary cross-sectional view at the A-A' cross section of the exemplary display panel illustrated in FIG. 6.

The first auxiliary conductive portion 81 may include a second transition region 34. In a direction from the bending zone 30 pointing to the non-bending zone 31, the second transition region 34 is located at an edge of the first auxiliary conductive portion 81. In the direction from the center of the first auxiliary conductive portion 81 pointing to the edge of the first auxiliary conductive portion 81, the thickness of the second transition portion 34 decreases. The thickness herein is the thickness in a direction perpendicular to the substrate 10.

Specifically, if a first auxiliary conductive portion 81 is disposed in a direction perpendicular to a substrate 10, and most or all of the first auxiliary conductive portion 81 are located in the bent region 30, the first auxiliary conductive portion 81 may have a significant height difference at the edge position in the direction from the bending portion 30 to the non-bending portion 31. When a first auxiliary conductive portion 81 has a region with a sharp thickness change, during a bending process, the region with a sharp thickness also has a sharp change in tensile stress. Therefore, a region with a sharp thickness change may easily fracture during a bending process.

In one embodiment, the first auxiliary conductive portion 81 includes a second transition region 34. In the direction from the center of the first auxiliary conductive portion 81 to the edge of the first auxiliary conductive portion 81, the thickness of the second transition region 34 decreases. That is to say, the change of the thickness of the first auxiliary conductive portion 81 in the second transition region 34 is gradual. When the thickness change is gradual, the change of the tensile stress at the thickness gradation region is also gradual during a bending process. This thickness gradation design may avoid a sharp increase in tensile stress that may cause the first auxiliary conductive portion 81 to fracture during a bending procedure. When the first auxiliary conductive portion 81 does not fracture, the fracture possibility of the first signal line 11 is negligible. This design is equivalent to improving the reliability of a first auxiliary conductive portion 81 for protecting a first signal line 11.

Optionally, referring to FIG. 8, a second transition region 34 is located in a non-bending zone 31. In the bending process of a bending zone 30, the tensile stress received by the portion of the first auxiliary conductive portion 81 at the bending portion 30 is greater than the tensile stress received by the portion of the first auxiliary conductive portion 81 at the portion of the non-bending portion 31. When the second transition region 34 whose thickness gradually changes is disposed in the non-bending zone 31, the tensile stress received by the second transition region 34 is small. This configuration may reduce the fracture possibility of a second transition region 34 due to the influence of tensile stress when a bending zone 30 is bent, and therefore the first auxiliary conductive portion 81 may provide better protection to a first signal line 11.

In addition, if a second transition region 34 is disposed in a bending zone 30, since the tensile stress in the bending zone 30 is large, fracture is likely to occur if the first auxiliary conductive portion 81 has an uneven thickness in the bending zone 30. If a second transition region 34 is disposed in a non-bending zone 31, the thickness of the portion of the first auxiliary conductive portion 81 in the bending zone 30 may be kept uniform. In this way, the tensile stress in the bending zone 30 may be kept consistent, and the first auxiliary conductive portion 81 may be less prone to fracture.

Figure 9:
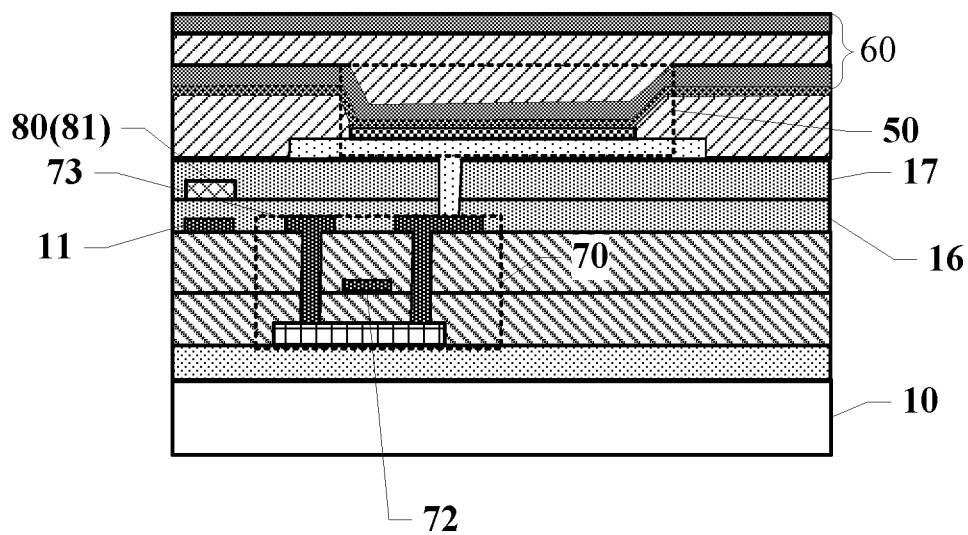
FIG. 9 illustrates an exemplary cross-sectional view at the B-B' cross section of the exemplary display panel illustrated in FIG. 6, consistent with the disclosed embodiments.

FIG. 9 illustrates an exemplary cross-sectional view at the B-B' cross section of the exemplary display panel illustrated in FIG. 6. As shown in FIG. 9, an auxiliary conductive portion 80 is disposed on the side of a first planarization layer 16 away from the substrate 10. The display panel 100 further includes a second planarization layer 17 disposed on the side of the first planarization layer 16 away from the substrate 10. The display panel 100 further includes a light-emitting function layer 50, and the light-emitting function layer 50 is located on the side of the second planarization layer 17 away from the substrate 10. Since the first planarization layer 16 and the second planarization layer 17 are both thick organic layers, the auxiliary conductive portion 80 is disposed between the first planarization layer 16 and the second planarization layer 17. The second planarization layer 17 with a large thickness may easily cover the additionally provided auxiliary conductive portion 80.

This configuration can achieve the thickness increase of the auxiliary conductive portion 80, and thus reduce the wiring resistance corresponding to the auxiliary conductive portion 80. Further, the upper surface of the planarization layer is a flat surface. Even if a circuit pattern of an auxiliary conductive portion 80 is disposed, the insulating layer (the second planarization layer 17 in one embodiment) covering the auxiliary conductive portion 80 may do not have a step or undulation on the surface corresponding to the circuit pattern of the auxiliary conductive portion 80. Therefore, this configuration may facilitate the fabrication of subsequent layers, ensure the structural stability of other layers above the circuit pattern of the auxiliary conductive portion 80, and thus avoid the layer problem due to the introduction of the auxiliary conductive portion 80.

Figure 10:
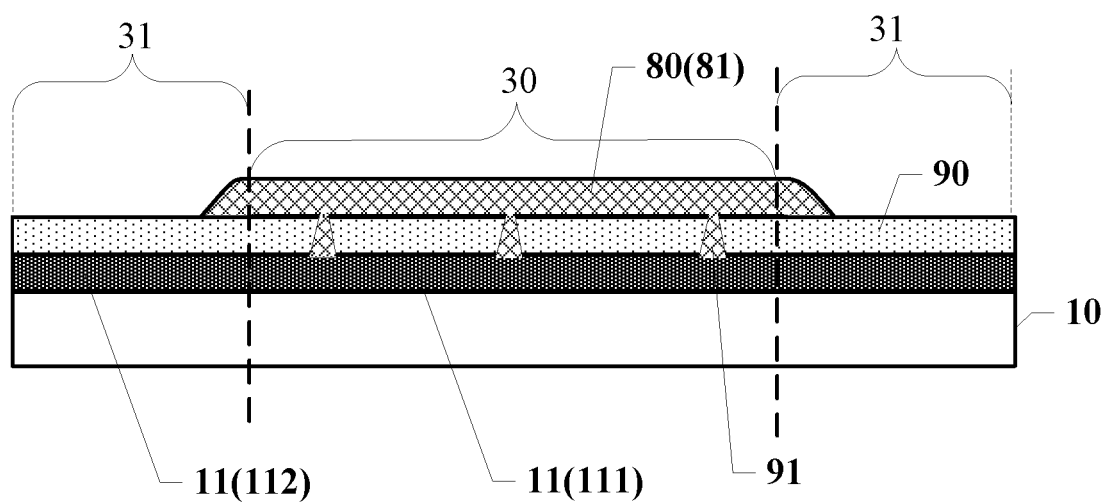
FIG. 10 illustrates another exemplary cross-sectional view at the A-A' cross section of the exemplary display panel illustrated in FIG. 6, consistent with the disclosed embodiments.

FIG. 10 illustrates another exemplary cross-sectional view at the A-A' cross section of the exemplary display panel illustrated in FIG. 6. As shown in FIG. 10, a first insulating layer 90 is disposed between the first auxiliary conductive portion 81 and the first signal line 11. The first insulating layer 90 includes a plurality of first via holes 91. At least a part of the first auxiliary conductive portions 81 are electrically connected to their corresponding first signal lines 11 through first via holes 91.

In one embodiment, the first auxiliary conductive portion 81 is separated from the first signal line 11 by the first insulating layer 90. In particular, the first auxiliary conductive portion 81 and its corresponding first signal line 11 are electrically connected through at least two first via holes 91. That is, the first auxiliary conductive portion 81 and its corresponding first signal line 11 are connected in parallel. When the portion 111 of the first signal line 11 located in the bending zone 30 cannot transmit signals normally, the first auxiliary conductive portion 81 connected in parallel with the first signal line 11 may be used to transmit signals. Therefore this configuration may effectively avoid a signal interruption phenomenon due to an abnormality in the portion 111 of the first signal line 11 located in the bending zone 30.

Further, the parallel connection between the portion 111 of a first signal line 11 located in a bending zone 30 and its corresponding first auxiliary conductive portion 81 can reduce the total resistance of the first signal line 11. When a first signal line 11 is used to transmit a signal, the electric resistance value of the first signal line 11 gradually increases from one end to the other end in the extending direction of the signal line, and so the signal voltage may gradually decrease. Therefore the signal strength may become weak gradually, and thus the display panel 100 may show an abnormal phenomenon. The disclosed embodiments reduce the total resistance of the first signal line 11 by connecting the portion 111 of the first signal line 11 located in the bending zone 30 with its corresponding first auxiliary conductive portion 81 in parallel, and thus reduces the tendency of signal voltage decrease during signal transmission from one end of the first signal line 11 to the other end of the first signal line 11. Therefore, this configuration can reduce the tendency that the signal strength may become weak, and avoid the phenomenon that the display panel 100 may exhibit a display abnormality.

Figure 11:
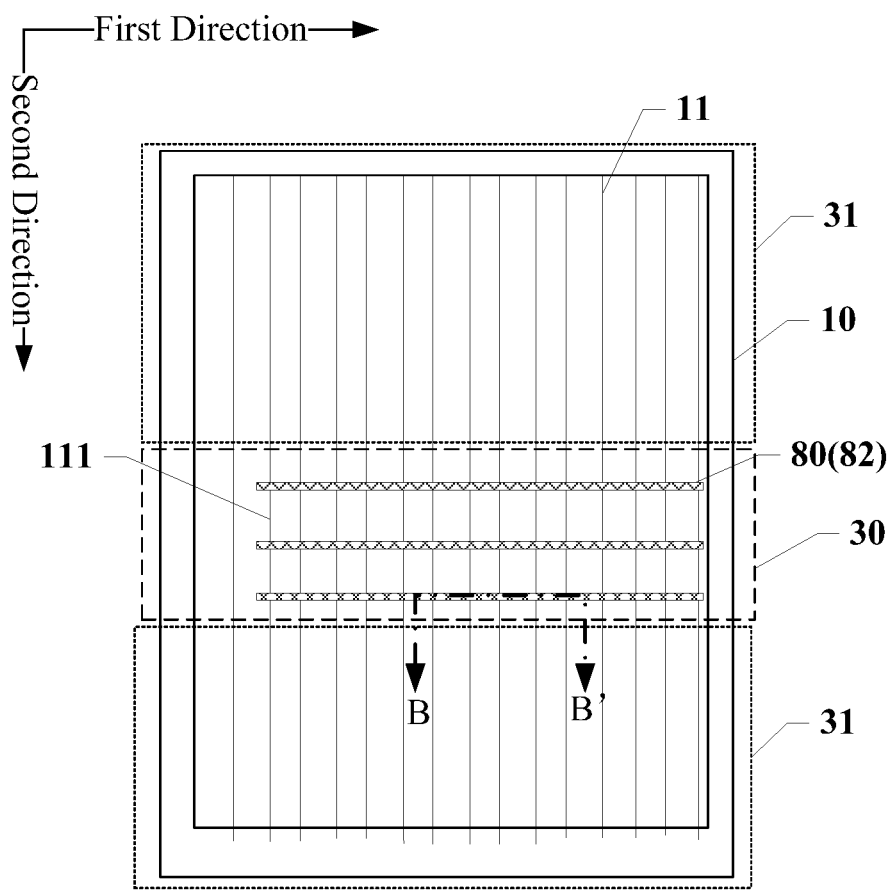
FIG. 11 illustrates a top view of another exemplary display panel consistent with the disclosed embodiments.
Figure 12:
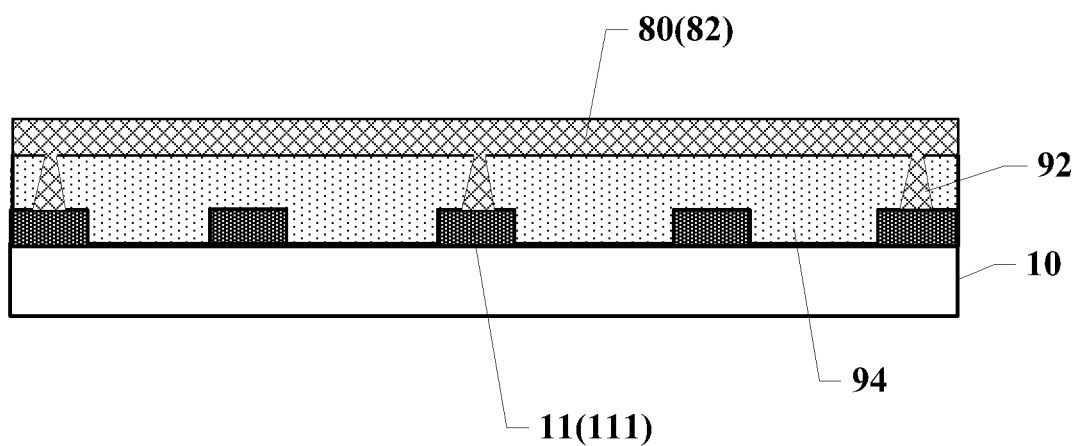
FIG. 12 illustrates an exemplary cross-sectional view at the B-B' cross section of the exemplary display panel illustrated in FIG. 11, consistent with the disclosed embodiments.

FIG. 11 illustrates a top view of another exemplary display panel, and FIG. 12 illustrates an exemplary cross-sectional view at the B-B' cross section of the exemplary display panel illustrated in FIG. 11.

Optionally, referring to FIG. 11 and FIG. 12, a first signal line 11 is a power line, and an auxiliary conductive portion 80 includes at least one second auxiliary conductive portion 82 extending in the first direction. A second insulating layer 94 is disposed between the second auxiliary conductive portion 82 and the first signal line 11. The second insulating layer 94 includes a plurality of second via holes 92. The plurality of second via holes 92 expose at least two different power lines. A second auxiliary conductive portion 82 is electrically connected to at least two power lines through second via holes 92 simultaneously.

Specifically, in one embodiment, the display panel includes a second auxiliary conductive portion 82 crossing the extending direction of the power lines. At least two different power lines are connected together through second auxiliary conductive portions 82 and second via holes 92. In a display panel 100, each power line is equipotential. When two or more power lines are connected together through second auxiliary conductive portions 82 and second via holes 92, the normal transmission of voltage signals by the power lines is not affected.

However, a display panel 100 in use may have an IR drop. The IR Drop is a voltage drop, referring to the phenomenon that during the process of transmitting a voltage signal, the electrical resistance of the power line gradually increases from the lower end of a display panel 100 to the upper end of the display panel 100, thereby causing the voltage to decrease gradually. For example, at the lower end of a display panel 100, the voltage value provided by the power line is 8V. Since the electrical resistance of the power line gradually increases, the voltage value may become 6V at the upper end of the display panel 100. This may result in a phenomenon that the brightness of the upper end of a display panel 100 is lower than the brightness at the lower end of the display panel 100, making the overall brightness of the display panel 100 not uniform. In one embodiment, power lines are connected together through second auxiliary conductive portions 82, thereby decreasing the electrical resistance of the power lines to a greatest extent. This configuration may weaken the voltage drop phenomenon in voltage transmission, and thereby may make the brightness of each area of the display panel 100 uniform.

Optionally, referring to FIG. 12, when a bending zone 30 is bent, a second auxiliary conductive portion 82 is located on the side of the first signal line 11 close to the convex side surface of the bending zone 30.

When the bending zone 30 is bent, the second auxiliary conductive portion 82 is close to the convex side surface of the bending zone 30, and the first signal line 11 is away from the convex side surface of the bending zone 30 with respect to the second auxiliary conductive portion 82. The convex side surface herein refers to the surface of the side of a display panel which is subjected to a tensile stress when the bending zone is bent. For example, when the extending direction of a bending axis is parallel to the first direction, and the display panel is bent downward from the light emitting surface of the display panel, the light emitting surface is a convex side surface. When a display panel is bent, the tensile stress may cause the molecular structure of a signal line to split, and the compressive stress may make the molecular structure of a signal line more compact. Therefore, a signal line may fracture under a tensile stress.

Further, the second auxiliary conductive portion 82 is located on the side of the first signal line 11 close to the convex side surface of the bending zone 30. At a same bending state, since the second auxiliary conductive portion 82 is stretched to a greater extent, the tensile stress received by the second auxiliary conductive portion 82 is larger. The first signal line 11 is stretched to a smaller extent, and the tensile stress received by the first signal line 11 is smaller. If the tensile stresses causing the second auxiliary conductive portion 82 and a first signal line 11, respectively, to fracture are N, during a bending process, even when the tensile stress received by the second auxiliary conductive portion 82 reaches N, the tensile stress received by the first signal line 11 may be less than N.

Therefore, if a fracture is likely to occur, the second auxiliary conductive portion 82 may fracture first, and maybe the first signal line 11 does not fracture. The introduction of the second auxiliary conductive portion 82 is equivalent to reducing the tensile stress received by the first signal line 11 during the bending process of the bending zone 30. This configuration may effectively reduce the fracture possibility of a first signal line 11 during the bending procedure of a bending zone 30.

Optionally, in other embodiments, the second auxiliary conductive portion may be disposed on the side of a first signal line close to the substrate.

When a display panel is bent, there is a neutral surface in the display panel. The neutral surface is a critical surface, wherein neither a tensile stress nor a compressive stress is applied during a bending process. The layer on the side of the neutral surface close to the convex side surface is subjected to a tensile stress, and the layer on the side of the neutral surface away from the convex side surface is subjected to a compressive stress. When a layer is placed at a position closer to the neutral surface, the layer receives a weaker stress. Since the bending endurance capability of an array layer is weak, the neutral plane is usually placed on the array layer as much as possible. However, since a light-emitting functional layer and a thin film encapsulation layer are disposed on the array layer in a display panel, the neutral surface may move up relative to the array layer.

When a first auxiliary conductive portion is disposed on the side of the first signal line close to the substrate, it is equivalent to increasing the thickness of the layer on the side of the first signal line close to the substrate, and the neutral surface may move down relative to the array layer, approaching the first signal line. In this case, since the first signal line becomes closer to the neutral surface, the stress received by the first signal line becomes weaker. Therefore this design may reduce the stress received by the first signal line during the bending process of a bending zone, reducing the fracture possibility of the first signal line during the bending process of the bending zone. Provided that other functions of a first auxiliary conductive portion are ensured, the position of a neutral surface may be adjusted by adjusting the first auxiliary conductive portion. In this way, the first signal line may be made to be closer to the neutral plane.

Figure 13:
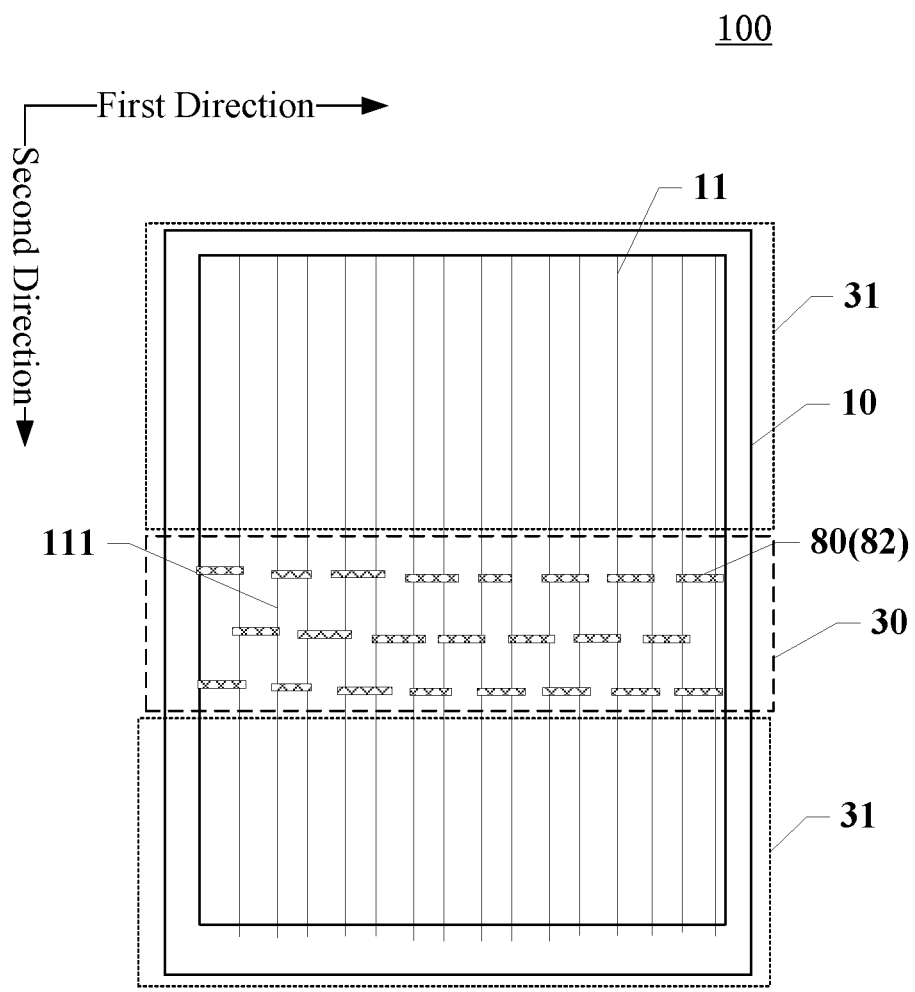
FIG. 13 illustrates a top view of another exemplary display panel consistent with the disclosed embodiments.

FIG. 13 illustrates a top view of another exemplary display panel. Referring to FIG. 13, the first signal line 11 is a power line, and the auxiliary conductive portion 80 includes a plurality of second auxiliary conductive portions 82 extending in the first direction. The second auxiliary conductive portion 82 has a segment structure and a plurality of second auxiliary conductive portions 82 are arranged at intervals in the first direction. A space is placed between the second auxiliary conductive portions 82 arranged in the first direction.

Using second auxiliary conductive portions 82 with a segment structure can prevent the phenomenon that the fracture of a second auxiliary conductive portion 82 may extend to other second auxiliary conductive portions 82 during the bending process of a bending zone. In addition, the second auxiliary conductive portions 82 have spacing regions in the first direction. When the extending direction of the bending axis is in the second direction, the spacing regions may be more easily bent than the regions disposed with second auxiliary conductive portions. Therefore, the spaced regions may provide a path for bending, thereby making whole display panel easier to be bent.

Figure 14:
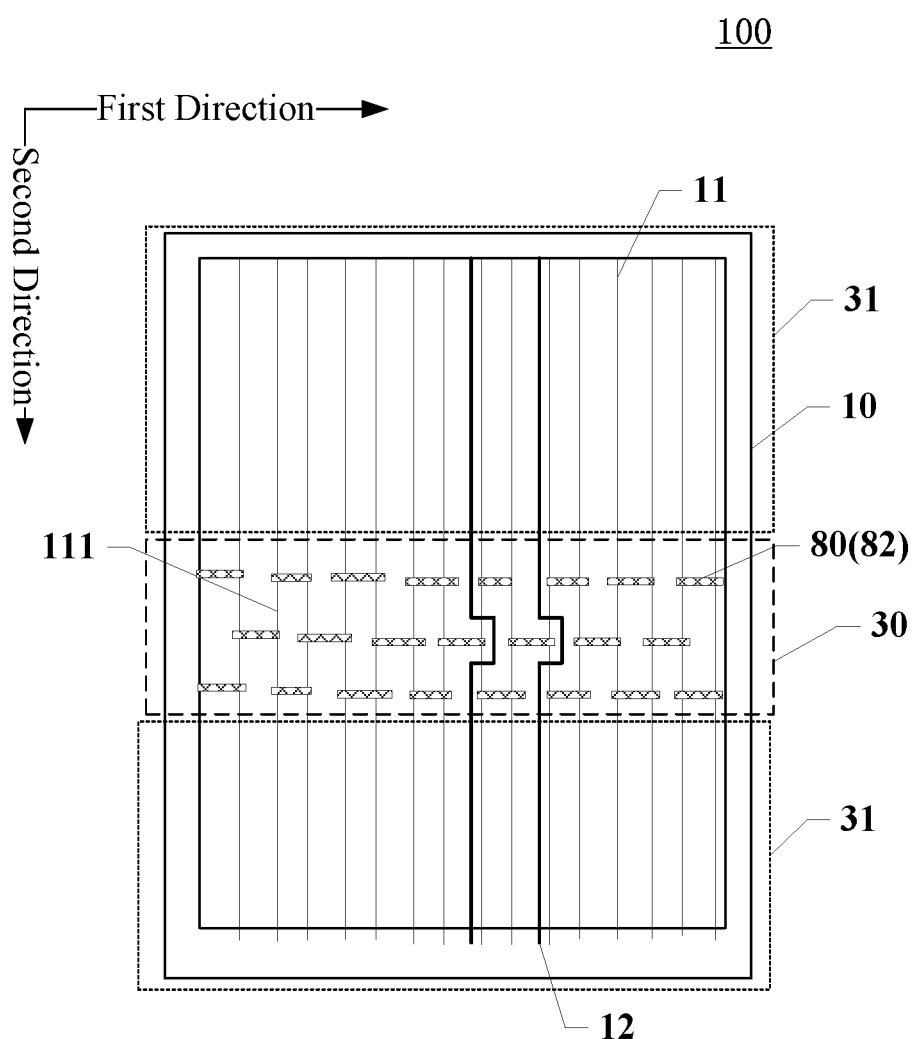
FIG. 14 illustrates a top view of another exemplary display panel consistent with the disclosed embodiments.

Further, if second signal lines 12 and second auxiliary conductive portions 82 are disposed in a same layer, the spacing regions of the second auxiliary conductive portions 82 may provide extension paths for the second signal lines. For example, FIG. 14 illustrates a top view of another exemplary display panel. In one embodiment, the display panel 100 further includes a second signal line 12. The second signal line 12 and the second auxiliary conductive portion 82 are disposed in a same layer, and have a same extending direction. The second signal line 12 has a folded line shape. The second signal line 12 may be, for example, an initialization signal line for providing initialization signals.

Disposing at least a part of the second signal lines 12 for providing initialization signals in a same layer with the second auxiliary conductive portion 82 can reduce the number of the second signal lines 12 on the array layer. This configuration can increase the distance between adjacent signal lines in a same unit area, and thus avoiding the crosstalk due to a close distance between signal lines.

Optionally, as shown in FIG. 13, each of the second auxiliary conductive portions 82 is alternately arranged in the second direction. The interval regions of the second auxiliary conductive portions 82 are alternate in the second direction, and thus the second signal line 12 may have a folded line shape. When the bending axis is parallel to the first direction, at least a part of the second signal line 12 is not perpendicular to the bending axis. The stress received by the entire second signal line 12 during a bending process may become small. Therefore the folded line structure can improve the bending endurance capability of a second signal line 12.

In addition, if the second auxiliary conductive portions 82 arranged in the second direction overlap with each other, when the bending axis is parallel to the second direction and located in an overlapping region of the second auxiliary conductive portions 82, it may be difficult to bend the display panel. However, as shown in FIG. 13, the spacing regions of the second auxiliary conductive portions 82 alternate in the second direction. Each part of the bending zone has a corresponding spacing region. Therefore, when the bending axis is located in the bending zone of a display panel, the bending degree of each part of the bending zone is similar. Compared to the configuration wherein the second auxiliary conductive portions 82 overlap with each other in the second direction, a display panel with the present configuration may be more easily bent.

Figure 15:
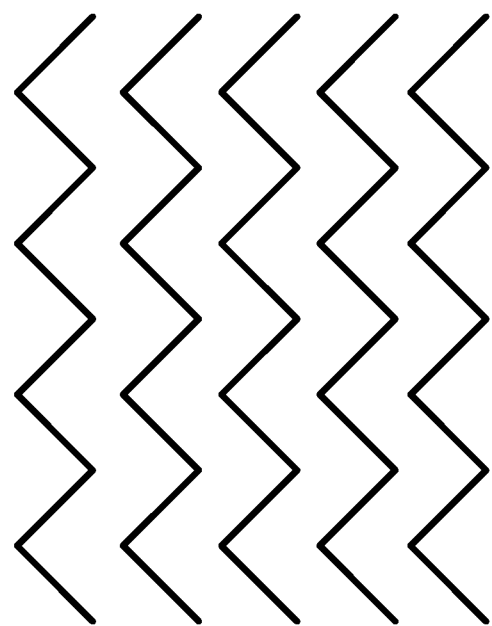
FIG. 15 illustrates an exemplary schematic structural diagram of first signal lines and/or at least a part of auxiliary conductive portions in an exemplary display panel consistent with the disclosed embodiments.
Figure 16:
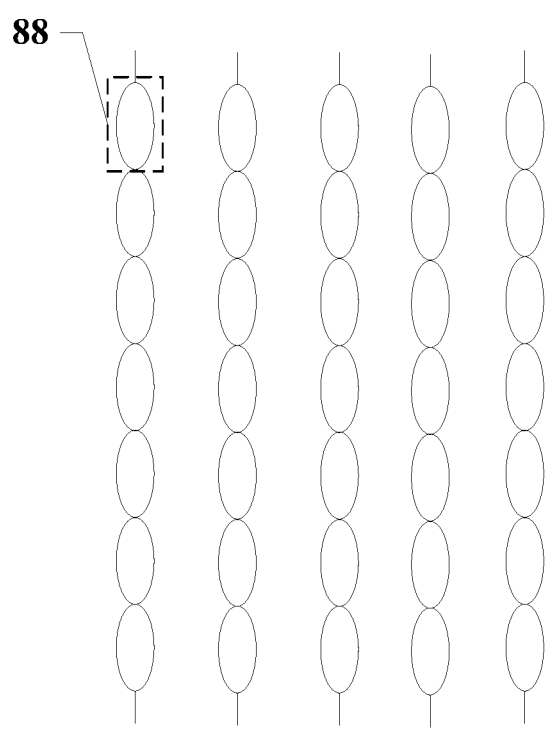
FIG. 16 illustrates another exemplary schematic structural diagram of first signal lines and/or at least a part of auxiliary conductive portions in an exemplary display panel consistent with the disclosed embodiments.

FIG. 15 illustrates an exemplary schematic structural diagram of first signal lines and/or at least a part of auxiliary conductive portions in an exemplary display panel. FIG. 16 illustrates another exemplary schematic structural diagram of first signal lines and/or at least a part of auxiliary conductive portions in an exemplary display panel.

Optionally, in a bending zone, at least a part of the first signal lines 11 and/or at least a part of the auxiliary conductive portions 80 have a zigzag shape or a grid shape. Specifically, in one embodiment, the first signal lines 11 and/or at least a part of the auxiliary conductive portions 80 in the bending zone may have a zigzag shape as shown in FIG. 15 or a grid shape as shown in FIG. 16. In comparison with a wiring pattern with a straight line structure, in a same unit area, under the condition that the wiring thickness and width are the same, the wiring area in the present configuration is increased, and thus a larger bending force is required for fracture. Therefore, a configuration with a zigzag shape or a grid shape can improve the bending endurance capability of a first signal line 11 and an auxiliary conductive portion 80.

In addition, when a grid structure is adopted, a first signal line 11 or an auxiliary conductive portion 80 may comprise a plurality of sub-grides 88 connected in series. The two branches of a sub-grid 88 are connected in parallel, and a sub-grid 88 is equivalent to two resistors connected in parallel. Therefore, this configuration can reduce the total resistance of a first signal line 11 or an auxiliary conductive portion 80, and can weaken the voltage drop phenomenon in voltage transmission or the signal weakening phenomenon in signal transmission. In addition, as the two branches in a sub-grid 88 are connected in parallel, if one of the branches is abnormal, the other branch may be used to transmit signals. Therefore, this design can avoid the occurrence of signal interruption. It should be noted that when first signal lines 11 and/or at least a part of the auxiliary conductive portions 80 are in a grid shape, the grid structure is not limited to the ellipse structure shown in FIG. 16, and other structures such as a diamond shape or a square shape may also be used.

Figure 17:
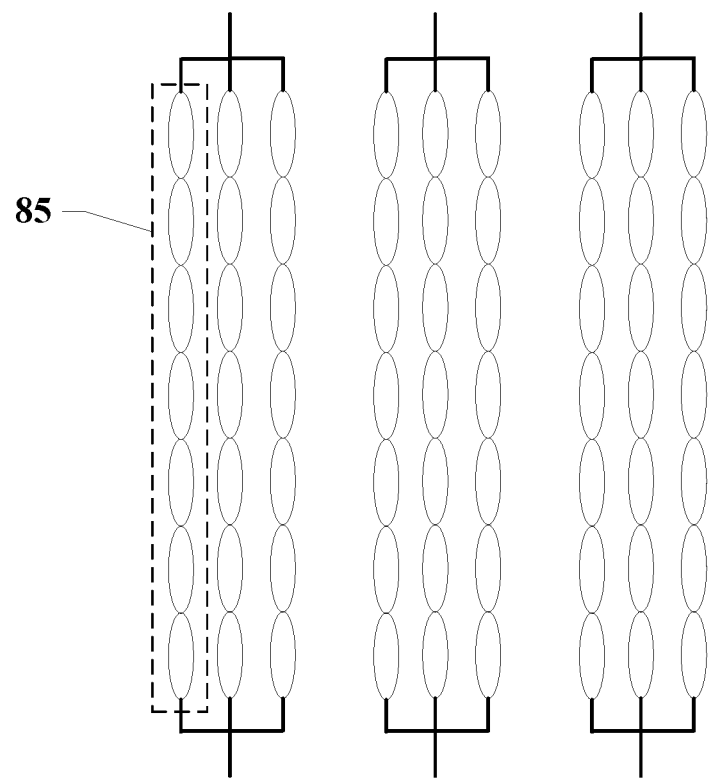
FIG. 17 illustrates another exemplary schematic structural diagram of first signal lines and/or at least a part of auxiliary conductive portions in an exemplary display panel consistent with the disclosed embodiments.

FIG. 17 illustrates another exemplary schematic structural diagram of first signal lines and/or at least a part of auxiliary conductive portions in an exemplary display panel.

Optionally, in a bending zone, at least one first signal line 11 and/or at least one auxiliary conductive portion 80 comprise a plurality of parallel sub-conductive portions 85, and the sub-conductive portion 85 may have a zigzag shape or a grid shape. In one embodiment, one signal line and/or at least one auxiliary conductive portion 80 is divided into a plurality of sub-conductive portions 85 connected in parallel. During signal transmission, signals can be transmitted through any of the sub-conductive portions 85. Even if one or several sub-conductive portions 85 are abnormal, signals may be transmitted through other sub-conductive portions 85, thereby effectively avoiding the phenomenon of signal transmission interruption.

In addition, the parallel connection of sub-conductive portions 85 can reduce the total resistance of the first signal line 11 and/or the auxiliary conductive portion 80. Therefore, this configuration can reduce the voltage drop phenomenon during voltage transmission or the signal weakening phenomenon during signal transmission. Moreover, the configuration with a plurality of sub-conductive portions 85 connected in parallel can improve the bending endurance capacity of the first signal line 11 and/or the auxiliary conductive portion 80. Further, in one embodiment, even if a part of sub-conductive portions 85 fracture, the first signal line 11 may still perform normal signal transmission.

Figure 18:
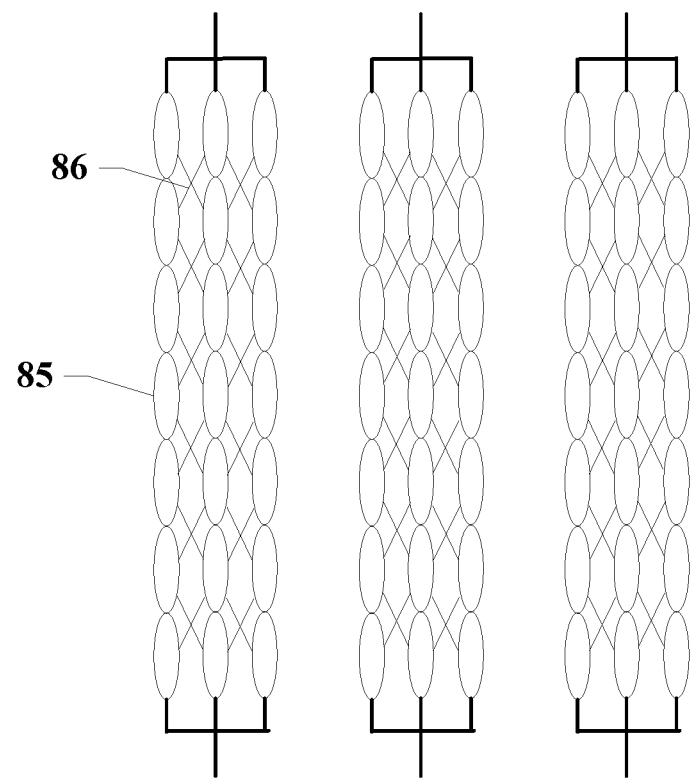
FIG. 18 illustrates another exemplary schematic structural diagram of first signal lines and/or at least a part of auxiliary conductive portions in an exemplary display panel consistent with the disclosed embodiments.

FIG. 18 illustrates another exemplary schematic structural diagram of first signal lines and/or at least a part of auxiliary conductive portions in an exemplary display panel.

Optionally, in a first signal line 11 and/or an auxiliary conductive portion 80, adjacent sub-conductive portions 85 are electrically connected by a plurality of first metal wires 86. The orthographic projections of at least two first metal wires 86 on the substrate intersect.

In one embodiment, adjacent sub-conductive portions 85 are electrically connected by a plurality of intersecting metal wires, so that the first signal wire 11 and/or the auxiliary conductive portion 80 become a grid structure. A first signal line 11 or an auxiliary conductive portion 80 with a grid structure has a stronger bending endurance capability. In addition, this grid structure includes a plurality of conductive branches. Any conductive branch that connects one end of the grid structure and the other end of the grid structure may be used to transmit signals. That is, this design provides several feasible paths for signal transmission. Even if some conductive branches exhibit abnormalities, normal transmission of signals is not affected. Therefore, this design may improve the reliability of signal transmission of a first signal line 11 or an auxiliary conductive portion 80.

Figure 19:
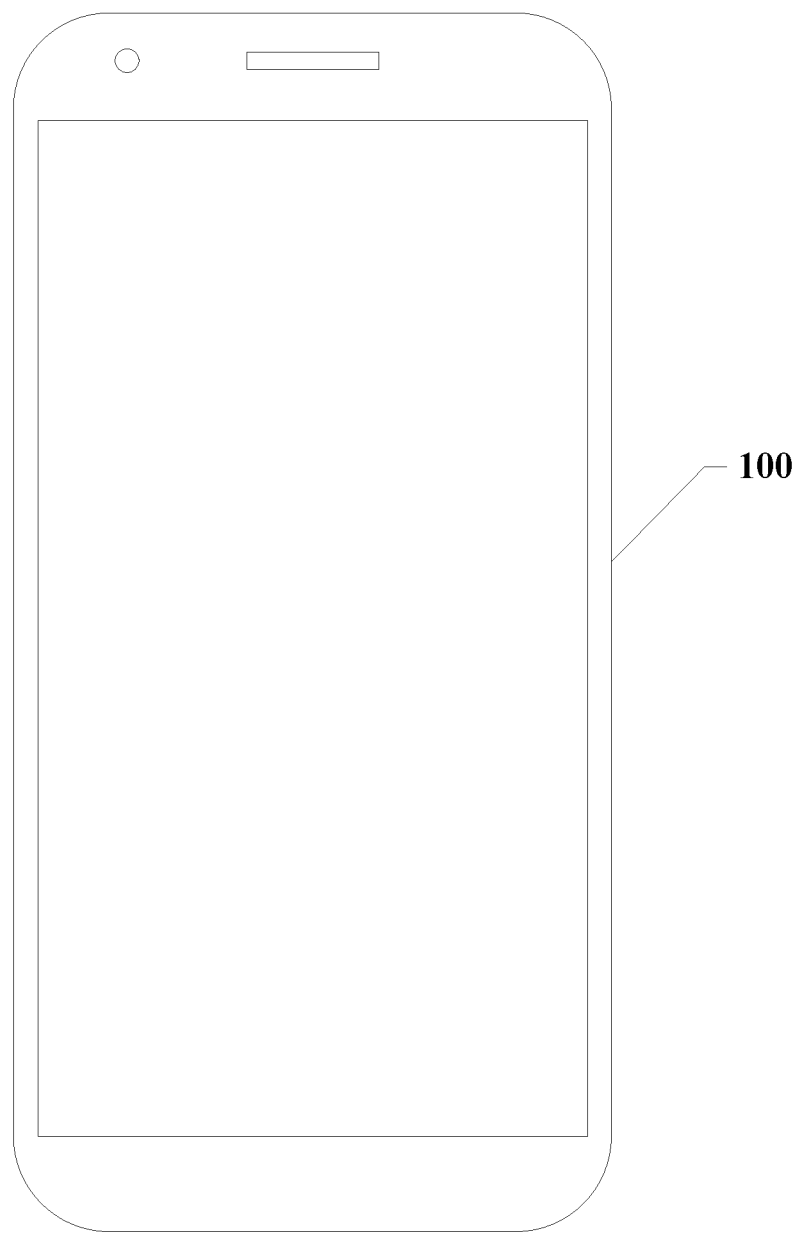
FIG. 19 illustrates a schematic structural diagram of an exemplary display device consistent with the disclosed embodiments.

FIG. 19 illustrates a schematic structural diagram of an exemplary display device consistent with the disclosed embodiments. As shown in FIG. 19, an exemplary display device 200 may comprise a display panel 100 with any one of the exemplary configurations of the above embodiments. The display device 200 may be any product or component having a display function, such as a tablet computer, a notebook computer, a television, a monitor, a digital photo frame, a navigation system, a smartphone, a smartwatch, and the like. Although a smartphone is shown in FIG. 19, the display device 200 may be any appropriate type of content-presentation devices including any of the disclosed display panels. Because the disclosed display device 200 includes a disclosed display panel, the disclosed display device may also exhibit same advantages as the disclosed display panel.

The display panel and the display device provided by the present disclosure include a bending zone and a non-bending zone. A first signal line disposed on the substrate extends at least from the non-bending zone to the bending zone. In particular, the thickness of the portion of the first signal line located in the bending zone is larger than the thickness of the portion of the first signal line located in the non-bending zone. When the bending zone is bent, compared with the portion with a normal thickness, the thicker portion of the first signal line requires a larger bending stress to fracture. That is, the method of increasing the thickness of the portion of the first signal line located in the bent zone can improve the bending endurance capability of the portion of the first signal line located in the bent zone, and can reduce the fracture possibility of the first signal line when the bending zone is bent. Alternatively, an auxiliary conductive portion overlapping with a first signal line is disposed in the bending zone. When the bending zone is bent, the auxiliary conductive portion may transfer at least a part of bending stress, and reduce the bending stress actually received by the first signal line. Therefore, this configuration can reduce the fracture possibility of a first signal line when the bending zone is bent.

The embodiments disclosed herein are exemplary only and not limiting the scope of this disclosure. Various combinations, alternations, modifications, or equivalents to the technical solutions of the disclosed embodiments can be obvious to those skilled in the art and can be included in this disclosure. Without departing from the spirit and scope of this invention, such other modifications, equivalents, or improvements to the disclosed embodiments are intended to be encompassed within the scope of the present disclosure.

What is claimed is:

1. A display panel comprising:
   a substrate including a bending zone and a non-bending zone, wherein:
   the substrate is disposed with first signal lines; the first signal lines are arranged in a first direction and extend in a second direction; the first direction intersects with the second direction; the first signal lines extend at least from the non-bending zone to the bending zone;
   the display panel further includes at least one auxiliary conductive portion located in the bending zone, wherein the orthographic projection of the auxiliary conductive portion on the substrate overlaps with the orthographic projection of the first signal line on the substrate;
   the auxiliary conductive portion includes at least one first auxiliary conductive portion extending in the second direction;
   a first insulating layer is disposed between the first auxiliary conductive portion and the first signal line;
   the first insulating layer includes a plurality of first via holes; and
   at least a part of the first auxiliary conductive portions are electrically connected to their corresponding first signal lines through first via holes.

2. The display panel according to claim 1, wherein an extending direction of the bending axis of the bending zone is in the first direction.

3. The display panel according to claim 1, wherein, in the bending zone, at least a part of the first signal lines, or at least a part of the auxiliary conductive portions, or both have either a zigzag shape or a grid shape.

4. The display panel according to claim 1, wherein:
   the orthographic projection of the first auxiliary conductive portion on the substrate overlaps with the orthographic projection of the first signal line on the substrate.

5. The display panel according to claim 4, wherein:
   the first auxiliary conductive portion includes a second transition region;
   in the direction from the bending zone pointing to the non-bending zone, the second transition region is located at the edge of the first auxiliary conductive portion; and
   in the direction from the center of the first auxiliary conductive portion pointing to the edge of the first auxiliary conductive portion, the thickness of the second transition portion decreases, wherein the thickness is the thickness in a direction perpendicular to the substrate.

6. The display panel according to claim 5, wherein the second transition region is located in the non-bending zone.

7. The display panel according to claim 4, wherein, when the bending zone is bent, the first auxiliary conductive portion is located on the side of the first signal line close to the convex side surface of the bending zone.

8. The display panel according to claim 4, wherein the first auxiliary conductive portion covers a surface at a side of the first signal line away from the substrate.

9. The display panel according to claim 1, wherein:
   the first signal line is a power line;
   the auxiliary conductive portion includes at least one second auxiliary conductive portion extending in the first direction;
   a second insulating layer is disposed between the second auxiliary conductive portion and the first signal line;
   the second insulating layer includes a plurality of second via holes, and the plurality of second via holes expose at least two different power lines; and
   a second auxiliary conductive portion is electrically connected to at least two power lines through the second via holes simultaneously.

10. The display panel according to claim 9, wherein, when the bending zone is bent, the second auxiliary conductive portion is located on the side of the first signal line close to the convex side surface of the bending zone.

11. The display panel according to claim 1, wherein:
    the display panel further includes a thin film transistor array layer and a first planarization layer, and the thin film transistor array layer is located between the first planarization layer and the substrate;
    the thin film transistor array layer includes a gate metal layer and a source/drain metal layer; and
    the first signal lines and the source/drain metal layer are disposed in a same layer.

12. The display panel according to claim 11, wherein:
    the auxiliary conductive portion is disposed on the side of a first planarization layer away from the substrate;
    the display panel further includes a second planarization layer disposed on the side of the first planarization layer away from the substrate; and
    the display panel further includes a light-emitting function layer, and the light-emitting function layer is located on the side of the second planarization layer away from the substrate.

13. The display panel according to claim 1, wherein:
    in the bending zone, at least one of the auxiliary conductive portions includes a plurality of sub-conductive portions connected in parallel.

14. The display panel according to claim 13, wherein:
in a same auxiliary conductive portion, adjacent sub-conductive portions are electrically connected by a plurality of first metal wires; and
orthographic projections of at least two of the plurality of first metal wires on the substrate intersect with each other.

15. A display device, comprising:
a display panel comprising a substrate that includes a bending zone and a non-bending zone, wherein:
the substrate is disposed with first signal lines; the first signal lines are arranged in a first direction and extend in a second direction; the first direction intersects with the second direction; the first signal lines extend at least from the non-bending zone to the bending zone;
the display panel further includes at least one auxiliary conductive portion located in the bending zone, wherein the orthographic projection of the auxiliary conductive portion on the substrate overlaps with the orthographic projection of the first signal line on the substrate;
the auxiliary conductive portion includes at least one first auxiliary conductive portion extending in the second direction;
a first insulating layer is disposed between the first auxiliary conductive portion and the first signal line;
the first insulating layer includes a plurality of first via holes; and
at least a part of the first auxiliary conductive portions are electrically connected to their corresponding first signal lines through first via holes.

\* \* \* \* \*